United States Patent
Balakrishnan et al.

(10) Patent No.: US 11,177,372 B2
(45) Date of Patent: Nov. 16, 2021

(54) STACKED VERTICAL TRANSPORT FIELD EFFECT TRANSISTOR ELECTRICALLY ERASABLE PROGRAMMABLE READ ONLY MEMORY (EEPROM) DEVICES

(71) Applicant: INTERNATIONAL BUSINESS MACHINES CORPORATION, Armonk, NY (US)

(72) Inventors: Karthik Balakrishnan, White Plains, NY (US); Jeng-Bang Yau, Yorktown Heights, NY (US); Alexander Reznicek, Troy, NY (US); Tak H. Ning, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 103 days.

(21) Appl. No.: 16/671,844

(22) Filed: Nov. 1, 2019

(65) Prior Publication Data

US 2020/0066874 A1     Feb. 27, 2020

Related U.S. Application Data

(63) Continuation of application No. 15/979,557, filed on May 15, 2018, now Pat. No. 10,468,503.

(51) Int. Cl.
    *H01L 29/76*       (2006.01)
    *H01L 29/94*       (2006.01)
      (Continued)

(52) U.S. Cl.
    CPC .... *H01L 29/6681* (2013.01); *H01L 27/11521* (2013.01); *H01L 29/0649* (2013.01);
      (Continued)

(58) Field of Classification Search
    CPC ......... H01L 27/11521; H01L 27/11582; H01L 29/0649; H01L 29/0847; H01L 29/4232;
      (Continued)

(56) References Cited

U.S. PATENT DOCUMENTS 7,368,788 B2    5/2008   Huo et al.
8,705,280 B2    4/2014   Cai et al.
(Continued)

FOREIGN PATENT DOCUMENTS

CN       105264655 A     1/2016
WO      2017111866 A1     6/2017

OTHER PUBLICATIONS

List of IBM Patents or Patent Applications Treated as Related dated Nov. 1, 2019, 2 pages.
(Continued)

*Primary Examiner* — Theresa T Doan
(74) *Attorney, Agent, or Firm* — Tutunjian & Bitetto, P.C.; Robert Sullivan

(57) ABSTRACT

A vertically stacked set of an n-type vertical transport field effect transistor (n-type VT FET) and a p-type vertical transport field effect transistor (p-type VT FET) is provided. The vertically stacked set of the n-type VT FET and the p-type VT FET includes a first bottom source/drain layer on a substrate, that has a first conductivity type, a lower channel pillar on the first bottom source/drain layer, and a first top source/drain on the lower channel pillar, that has the first conductivity type. The vertically stacked set of the n-type VT FET and the p-type VT FET further includes a second bottom source/drain on the first top source/drain, that has a second conductivity type different from the first conductivity type, an upper channel pillar on the second bottom source/drain, and a second top source/drain on the upper channel pillar, that has the second conductivity type.

20 Claims, 12 Drawing Sheets

(51) Int. Cl.
  *H01L 29/66* (2006.01)
  *H01L 29/423* (2006.01)
  *H01L 27/11521* (2017.01)
  *H01L 29/08* (2006.01)
  *H01L 29/06* (2006.01)
  *H01L 29/78* (2006.01)

(52) U.S. Cl.
  CPC ...... H01L 29/0847 (2013.01); H01L 29/4232 (2013.01); H01L 29/785 (2013.01)

(58) Field of Classification Search
  CPC ............. H01L 29/665; H01L 29/66545; H01L 29/66666; H01L 29/6681; H01L 29/785; H01L 29/78642; H01L 29/7884; H01L 29/7889
  USPC ........................................................ 257/401
  See application file for complete search history.

(56) References Cited

U.S. PATENT DOCUMENTS

| | | | |
|---|---|---|---|
| 8,754,417 | B2 | 6/2014 | Christensen et al. |
| 9,806,173 | B2 | 10/2017 | Balakrishnan et al. |
| 9,824,933 | B1 | 11/2017 | Pawlak |
| 9,837,414 | B1 | 12/2017 | Balakrishnan et al. |
| 9,911,738 | B1 | 3/2018 | Niimi et al. |
| 2009/0200604 | A1 | 8/2009 | Chidambarrao et al. |
| 2014/0340952 | A1 | 11/2014 | Ramaswamy et al. |
| 2017/0154895 | A1 | 6/2017 | Huo |
| 2018/0005904 | A1 | 1/2018 | Lee et al. |
| 2018/0342516 | A1* | 11/2018 | Chiang ............ H01L 29/66666 |
| 2019/0067327 | A1* | 2/2019 | Herner ............ H01L 27/11568 |

OTHER PUBLICATIONS

Assaderaghi, et al., "A Novel Silicon-On-Indulator (SOI) MOSFET for Ultra Low Voltage Operation," 1994 IEEE Symposium on Low Power Electronics, Digest of Technical Papers. Oct. 10-12, 1994. pp. 58-59.

John Robertson, "Band offsets of wide-band-gap oxides and implications for future electronic devices," Journal of Vacuum Science & Technology B: Microelectronics and Nanometer Structures Processing, Measurement, and Phenomena. Volume 18. Issue 3. May/Jun. 2000. pp. 1785-1791.

Allowance and Fees Due issued in related U.S. Appl. No. 16/671,951 dated Jun. 21, 2021 (16 pgs).

* cited by examiner

STACKED VERTICAL TRANSPORT FIELD EFFECT TRANSISTOR ELECTRICALLY ERASABLE PROGRAMMABLE READ ONLY MEMORY (EEPROM) DEVICES

BACKGROUND

Technical Field

The present invention generally relates to forming vertical transport field effect transistors (VT FETs), and more particularly to forming complementary metal-oxide-semiconductor devices and electrically erasable programmable read-only memories (EEPROMs) from VT FETs.

Description of the Related Art

In an electrically erasable programmable read-only memory (EEPROM) a bit of data can be electrically stored and erased using different voltages. A complementary metal-oxide-semiconductor (CMOS) device can form a logic gate. A programmable CMOS device can be formed utilizing a p-type field effect transistor (PFET) and an n-type field effect transistor (NFET) with a common floating gate. The programming, erasure, and/or reprogramming can be effected by placement of a charge into the floating gate, where the CMOS device can control programming of the floating gate.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an NFET or a PFET can be formed.

SUMMARY

In accordance with an embodiment of the present invention, a vertically stacked set of an n-type vertical transport field effect transistor (n-type VT FET) and a p-type vertical transport field effect transistor (p-type VT FET) is provided. The vertically stacked set of the n-type VT FET and the p-type VT FET includes a first bottom source/drain layer on a substrate, wherein the first bottom source/drain layer has a first conductivity type. The vertically stacked set of the n-type VT FET and the p-type VT FET further includes a lower channel pillar on the first bottom source/drain layer, and a first top source/drain on the lower channel pillar, wherein the first top source/drain has the first conductivity type. The vertically stacked set of the n-type VT FET and the p-type VT FET further includes a second bottom source/drain on the first top source/drain, wherein the second bottom source/drain has a second conductivity type different from the first conductivity type, and an upper channel pillar on the second bottom source/drain, and a second top source/drain on the upper channel pillar, wherein the second top source/drain has the second conductivity type different from the first conductivity type.

In accordance with another embodiment of the present invention, an electrically erasable programmable read-only memory (EEPROM) array is provided. The electrically erasable programmable read-only memory (EEPROM) array includes a plurality of stacked vertical transport field effect transistors (VT FETs), wherein the stacked VT FETs each include an n-type vertical transport field effect transistor and a p-type vertical transport field effect transistor collinear with one another, and a first bit line connected to a source of at least one of the n-type vertical transport field effect transistors. The (EEPROM) array further includes a second bit line connected to a source of at least one of the p-type vertical transport field effect transistors, and a word line connected to a common drain of the at least one n-type vertical transport field effect transistor and the at least one p-type vertical transport field effect transistor.

In accordance with yet another embodiment of the present invention, a method of forming a vertically stacked set of an n-type vertical transport field effect transistor (n-type VT FET) and a p-type vertical transport field effect transistor (p-type VT FET) is provided. The method includes forming a first bottom source/drain layer on a substrate, wherein the first bottom source/drain layer has a first conductivity type, forming a lower channel layer on the first bottom source/drain layer, and forming a first top source/drain layer on the lower channel layer, wherein the first top source/drain layer has the first conductivity type. The method further includes forming a second bottom source/drain layer on the first top source/drain layer, wherein the second bottom source/drain layer has a second conductivity type different from the first conductivity type, forming an upper channel layer on the second bottom source/drain layer, and forming a second top source/drain layer on the upper channel layer, wherein the second top source/drain layer has the second conductivity type different from the first conductivity type. The method further includes forming one or more fin templates on the second top source/drain layer, and removing the portions of the second top source/drain layer and the other underlying layers not covered by the one or more fin templates down to the first bottom source/drain layer to form one or more vertically stacked sets of channel pillars and source/drains.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention generally relates to forming stacked vertical transport field effect transistors (VT FETs), and more particularly to forming complementary metal-oxide-semiconductor (CMOS) devices and electrically erasable programmable read-only memories (EE-PROMs) from stacked VT FETs. With the NFET and PFET stacked on top of each other, simple wiring of input, output, and power supply lines can be achieved, thus saving space/foot print area.

Embodiments of the present invention relate to forming a stacked complementary metal-oxide-semiconductor (CMOS) device, where an n-type vertical transport field effect transistor (VT NFET) and a p-type vertical transport field effect transistor (VT PFET) are vertically stacked on one another. Vertical stacking of two vertical transport field effect transistors allows the area occupied by each CMOS device to be essentially cut in half.

Embodiments of the present invention relate to forming electrically erasable programmable read only memory (EE-PROM) from vertically stacked vertical transport field effect transistors (VT FETs), where the vertical integration of the VT FETs can reduce costs and chip complexity. The n-type vertical transport field effect transistor and a p-type vertical transport field effect transistor can have floating gates to provide read/write functionality. Hot carrier injection can be achieved using $Si_3N_4$, $Y_2O$, $ZrO_2$, or $HfO_2$ for the floating gate dielectric. Carrier injection for writing to and erasing from the floating gate can be achieved at a Vds>1.5 V. The gate dielectric of the VT FETs forming the EEPROM can be thicker than the gate dielectric of a VT FET forming a logic device.

Embodiments of the present invention relate to electrically coupling the source/drains on the n-type vertical transport field effect transistor and a p-type vertical transport field effect transistor to form a common terminal.

Exemplary applications/uses to which the present invention can be applied include, but are not limited to: EEPROMS.

It is to be understood that aspects of the present invention will be described in terms of a given illustrative architecture; however, other architectures, structures, substrate materials and process features and steps can be varied within the scope of aspects of the present invention.

Figure 1:
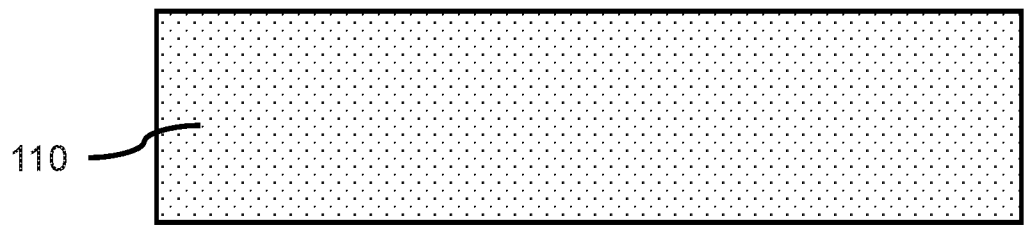
FIG. 1 is a cross-sectional side view showing a substrate, in accordance with an embodiment of the present invention.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide ($Si_xC_y$), silicon-germanium ($Si_xGe_y$), germanium (Ge), gallium-arsenide ($Ga_xAs_y$), cadmium-telluride ($Cd_xTe_y$), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper ($Mo_xCu_y$) composites, etc.), or combination thereof.

The substrate or active semiconductor layer can be a crystalline semiconductor, for example, a IV or IV-IV semiconductor (e.g., silicon (Si), silicon-germanium ($Si_xGe_y$), germanium (Ge)), a III-V semiconductor (e.g., gallium-arsenide ($Ga_xAs_y$), indium-gallium-arsenide ($In_xGa_yAs_z$), indium-phosphide ($In_xP_y$), indium-antimonide ($In_xSb_y$)), a II-VI semiconductor (e.g., cadmium-telluride ($Cd_xTe_y$), zinc-telluride ($Zn_xTe_y$), zinc sulfide ($ZnS_x$), zinc selenide ($Zn_xSe_y$)), or a IV-VI semiconductor (e.g., tin sulfide ($SnS_x$), lead selenide ($Pb_xSb_y$)).

Figure 2:
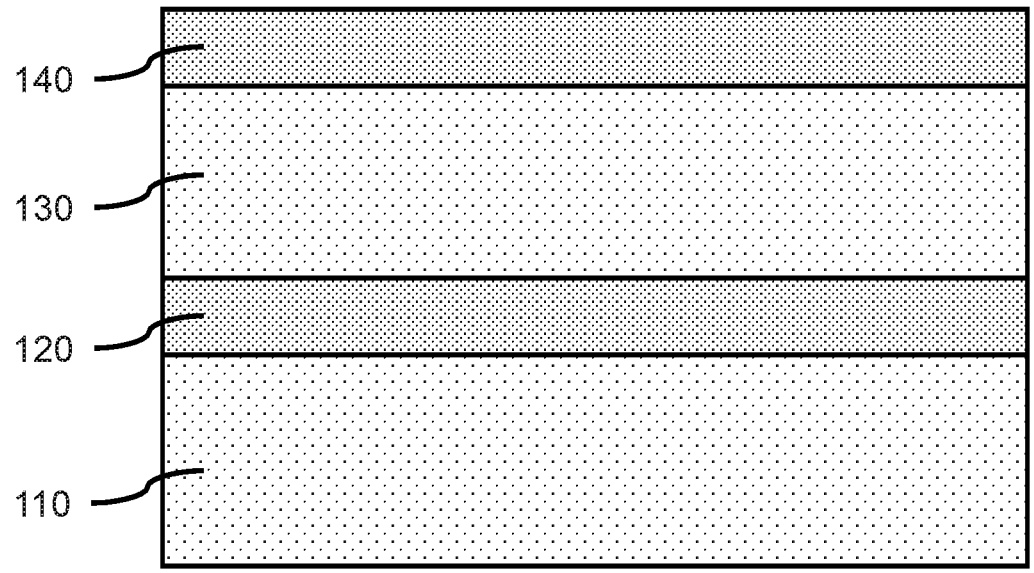
FIG. 2 is a cross-sectional side view showing a bottom PFET source/drain layer, a lower channel layer, and a top PFET source/drain layer on the substrate, in accordance with an embodiment of the present invention.

FIG. 2 is a cross-sectional side view showing a bottom PFET source/drain layer, a lower channel layer, and a top PFET source/drain layer on the substrate, in accordance with an embodiment of the present invention.

In one or more embodiments, a bottom PFET source/drain layer 120 can be formed on the substrate 110, where the bottom PFET source/drain layer 120 can be formed by epitaxial or heteroepitaxial growth on the substrate 110, for example, by reduced pressure chemical vapor deposition (RPCVD), rapid thermal chemical vapor deposition (RT-CVD), low pressure CVD (LPCVD), atmospheric pressure chemical vapor deposition (APCVD), molecular beam epitaxy (MBE), vapor phase epitaxy (VPE) or liquid phase epitaxy (LPE), low-energy plasma deposition (LEPD), ultra-high vacuum chemical vapor deposition (UHVCVD), or metal-organic CVD (MOCVD). The bottom PFET source/drain layer 120 can have the same crystal structure and orientation as the underlying substrate 110.

In one or more embodiments, the bottom PFET source/drain layer 120 can be made of a semiconductor material, including, but not limited to, silicon (Si), silicon-germanium ($Si_xGe_y$), indium-gallium-arsenide ($In_xGa_yAs_z$), or indium-phosphide ($In_xP_y$).

In various embodiments, the bottom source/drain layer 120 can be doped using suitable doping techniques, including but not limited to, ion implantation, gas phase doping, plasma doping, plasma immersion ion implantation, cluster doping, infusion doping, liquid phase doping, solid phase doping, etc. Doping can be by in-situ doping (where doping and epitaxy growth are performed at the same time), and/or ex-situ doping (where doping occurs before and/or after epitaxy). The dopants can be p-type (e.g., boron (B), aluminum (Al), gallium (Ga), indium (In), for Si or silicon-germanium ($Si_xGe_y$), and Si, Ge, or tin (Sn) for indium-gallium-arsenide ($In_xGa_yAs_z$), or indium-phosphide ($In_xP_y$)).

In various embodiments, the doping sequence can be reversed, and the dopants can be n-type (e.g., phosphorus (P), arsenic (As), antimony (Sb) for Si or $Si_xGe_y$, and selenium (Se) or tellurium (Te) for $In_xGa_yAs$, or $In_xP_y$) to form NFETs.

In one or more embodiments, the bottom PFET source/drain layer 120 can have a thickness in the range of about 20 nanometers (nm) to about 100 nm, or in the range of about 30 nm to about 50 nm, although other thicknesses are also contemplated.

In one or more embodiments, a lower channel layer 130 can be formed on the bottom PFET source/drain layer 120, where the lower channel layer 130 can be formed by epitaxial or heteroepitaxial growth on the substrate 110. The lower channel layer 130 can have the same crystal structure and orientation as the underlying bottom PFET source/drain layer 120.

In one or more embodiments, the lower channel layer 130 can be made of a semiconductor material, including, but not limited to, intrinsic silicon (Si), silicon-germanium ($Si_xGe_y$), carbon-doped silicon (Si:C), or indium-gallium-arsenide ($In_xGa_yAs_z$). In various embodiments, the lower channel layer 130 can be undoped.

In one or more embodiments, the lower channel layer 130 can have a thickness in the range of about 10 nm to about 50 nm, or in the range of about 15 nm to about 30 nm, although other thicknesses are also contemplated. The thickness of the lower channel layer 130 can determine the height of a subsequently formed lower channel pillar.

In one or more embodiments, a top PFET source/drain layer 140 can be formed on the lower channel layer 130, where the top PFET source/drain layer 140 can be formed by epitaxial or heteroepitaxial growth. The top PFET source/drain layer 140 can have the same crystal structure and orientation as the underlying lower channel layer 130.

In one or more embodiments, the top PFET source/drain layer 140 can be made of a semiconductor material, including, but not limited to, silicon (Si), silicon-germanium ($Si_xGe_y$), or indium-gallium-arsenide ($In_xGa_yAs_z$), or indium-phosphide ($In_xP_y$). In various embodiments, the top PFET source/drain layer 140 can be p-doped.

In various embodiments, the top PFET source/drain layer 140 can be doped by in-situ doping (where doping and epitaxy growth are performed at the same time). In-situ doping can be utilized with the epitaxial growth to maintain sharp junctions and interfaces. The dopants can be p-type (e.g., boron (B), aluminum (Al), gallium (Ga), indium (In), for Si or $Si_xGe_y$, and magnesium (Mg) or zinc (Zn) for $In_xGa_yAs_z$)). In various embodiments, the doping sequence can be reversed, and the dopants can be n-type.

In one or more embodiments, the top PFET source/drain layer 140 can have a thickness in the range of about 10 nm to about 100 nm, or in the range of about 30 nm to about 60 nm, although other thicknesses are also contemplated.

Figure 3:
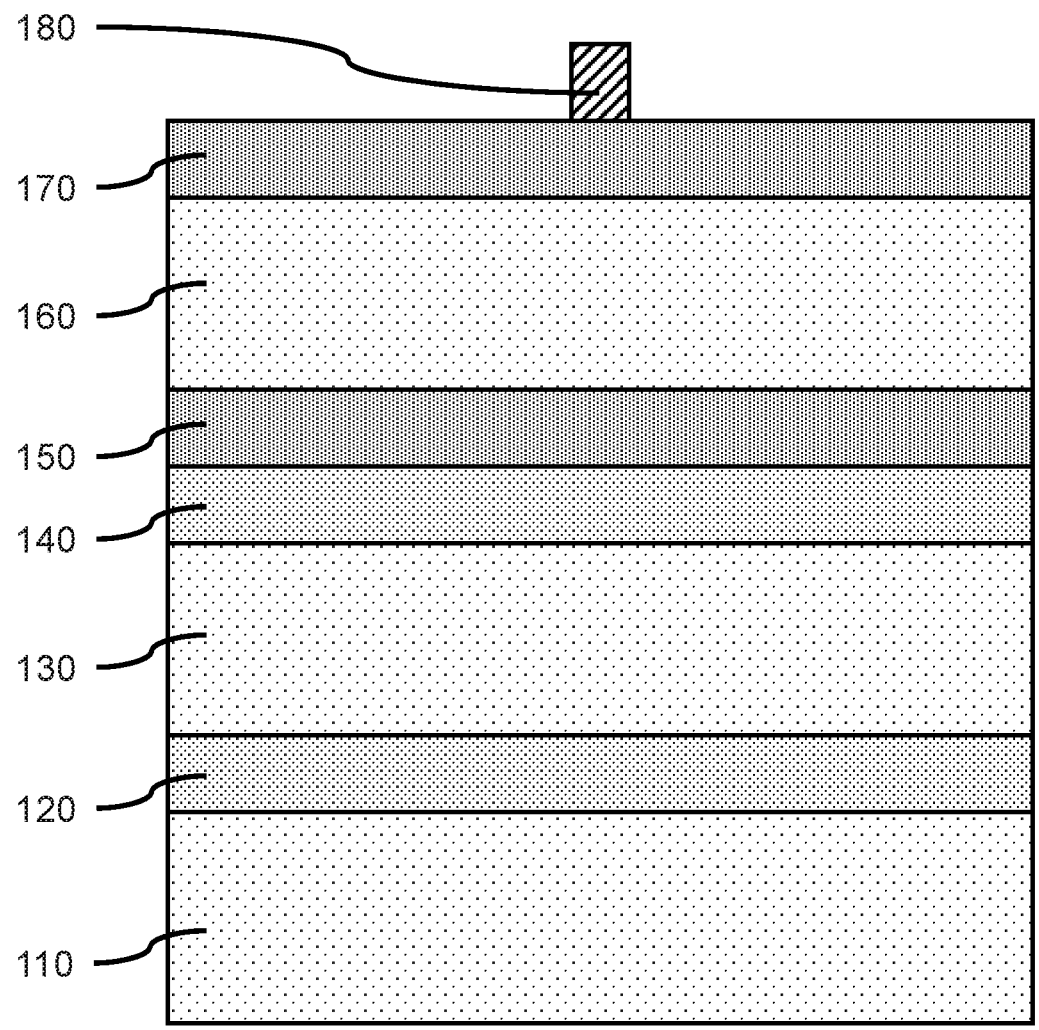
FIG. 3 is a cross-sectional side view showing a bottom NFET source/drain layer on the top PFET source/drain layer, an upper channel layer, and a top NFET source/drain layer, in accordance with an embodiment of the present invention.

FIG. 3 is a cross-sectional side view showing a bottom NFET source/drain layer on the top PFET source/drain layer, an upper channel layer, and a top NFET source/drain layer, in accordance with an embodiment of the present invention.

In one or more embodiments, a bottom NFET source/drain layer 150 can be formed on the top PFET source/drain layer 140, where the bottom NFET source/drain layer 150 can be formed by epitaxial or heteroepitaxial growth on the top PFET source/drain layer 140. The bottom NFET source/drain layer 150 can have the same crystal structure and orientation as the underlying top PFET source/drain layer 140.

In one or more embodiments, the bottom NFET source/drain layer 150 can be made of a semiconductor material, including, but not limited to, silicon (Si), carbon-doped silicon (Si:C), indium-gallium-arsenide ($In_xGa_yAs_z$), or indium-phosphide ($In_xP_y$).

In various embodiments, the bottom NFET source/drain layer 150 can be doped by in-situ doping (where doping and epitaxy growth are performed at the same time). The dopants can be n-type (e.g., phosphorus, arsenic, antimony for Si or $Si_xGe_y$, and Se or Te for $In_xGa_yAs_z$ or $In_xP_y$).

In various embodiments, the doping sequence can be reversed, and the dopants can be p-type (e.g., B, Al, Ga, In, for Si or $Si_xGe_y$, and Mg or Zn for $In_xGa_yAs_z$ or $In_xP_y$).

In one or more embodiments, the bottom NFET source/drain layer 150 can have a thickness in the range of about 10 nm to about 100 nm, or in the range of about 30 nm to about 60 nm, although other thicknesses are also contemplated.

In one or more embodiments, an upper channel layer 160 can be formed on the bottom NFET source/drain layer 150, where the upper channel layer 160 can be formed by epitaxial or heteroepitaxial growth on the bottom NFET source/drain layer 150. The upper channel layer 160 can have the same crystal structure and same orientation as the underlying bottom NFET source/drain layer 150.

In one or more embodiments, the upper channel layer 160 can be made of a semiconductor material, including, but not limited to, silicon (Si), silicon-germanium ($Si_xGe_y$), carbon-doped silicon (Si:C), or indium-gallium-arsenide ($In_xGa_yAs_z$). The upper channel layer 160 can be a different semiconductor material than the lower channel layer 130. In various embodiments, the upper channel layer 160 can be undoped.

In one or more embodiments, the upper channel layer 160 can have a thickness in the range of about 10 nm to about 50 nm, or in the range of about 15 nm to about 30 nm, although other thicknesses are also contemplated. The thickness of the upper channel layer 160 can determine the height of a subsequently formed upper channel pillar.

In one or more embodiments, a top NFET source/drain layer 170 can be formed on the upper channel layer 160, where the top NFET source/drain layer 170 can be formed by epitaxial or heteroepitaxial growth on the upper channel layer 160. The top NFET source/drain layer 170 can have the same crystal structure and orientation as the underlying upper channel layer 160.

In one or more embodiments, the top NFET source/drain layer 170 can be made of a semiconductor material, including, but not limited to, silicon (Si), carbon-doped silicon (Si:C), indium-gallium-arsenide ($In_xGa_yAs_z$), or indium-phosphide ($In_xP_y$).

In various embodiments, the top NFET source/drain layer 170 can be doped by in-situ doping (where doping and epitaxy growth are performed at the same time). The dopants can be n-type (e.g., phosphorus, arsenic, antimony for Si or $Si_xGe_y$, and Se or Te for $In_xGa_yAs$, or $In_xP_y$).

In one or more embodiments, the top NFET source/drain layer 170 can have a thickness in the range of about 20 nm to about 100 nm, or in the range of about 30 nm to about 60 nm, although other thicknesses are also contemplated. The top NFET source/drain layer 170 and the bottom PFET source/drain layer 120 can be thicker than the top PFET source/drain layer 140 and the bottom NFET source/drain layer 150 to allow for reduced access resistances and provide easier contacting and increased contact area.

In various embodiments, each of the layers 120, 130, 140, 150, 160, 170 can be formed by epitaxial growth through varying the layer precursors and doping gasses with precise time, temperature, and process controls, to form the whole device stack in-situ (i.e., in a single process chamber) using a continuous sequence of processes.

In one or more embodiments, a template layer can be formed on the top NFET source/drain layer 170, where the template layer can be a hardmask layer, a softmask layer, or a combination thereof. The template layer can be patterned using a lithographic process and resist to form one or more fin templates 180 on the top NFET source/drain layer 170.

In one or more embodiments, the template layer can be a hard mask layer formed on the top NFET source/drain layer 170, for example, by chemical vapor deposition (CVD) or plasma enhanced CVD (PECVD). The hard mask layer can be a dielectric material, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof. The hard mask layer 140 can be selectively etchable relative to the channel layers and source/drain layers.

Figure 4:
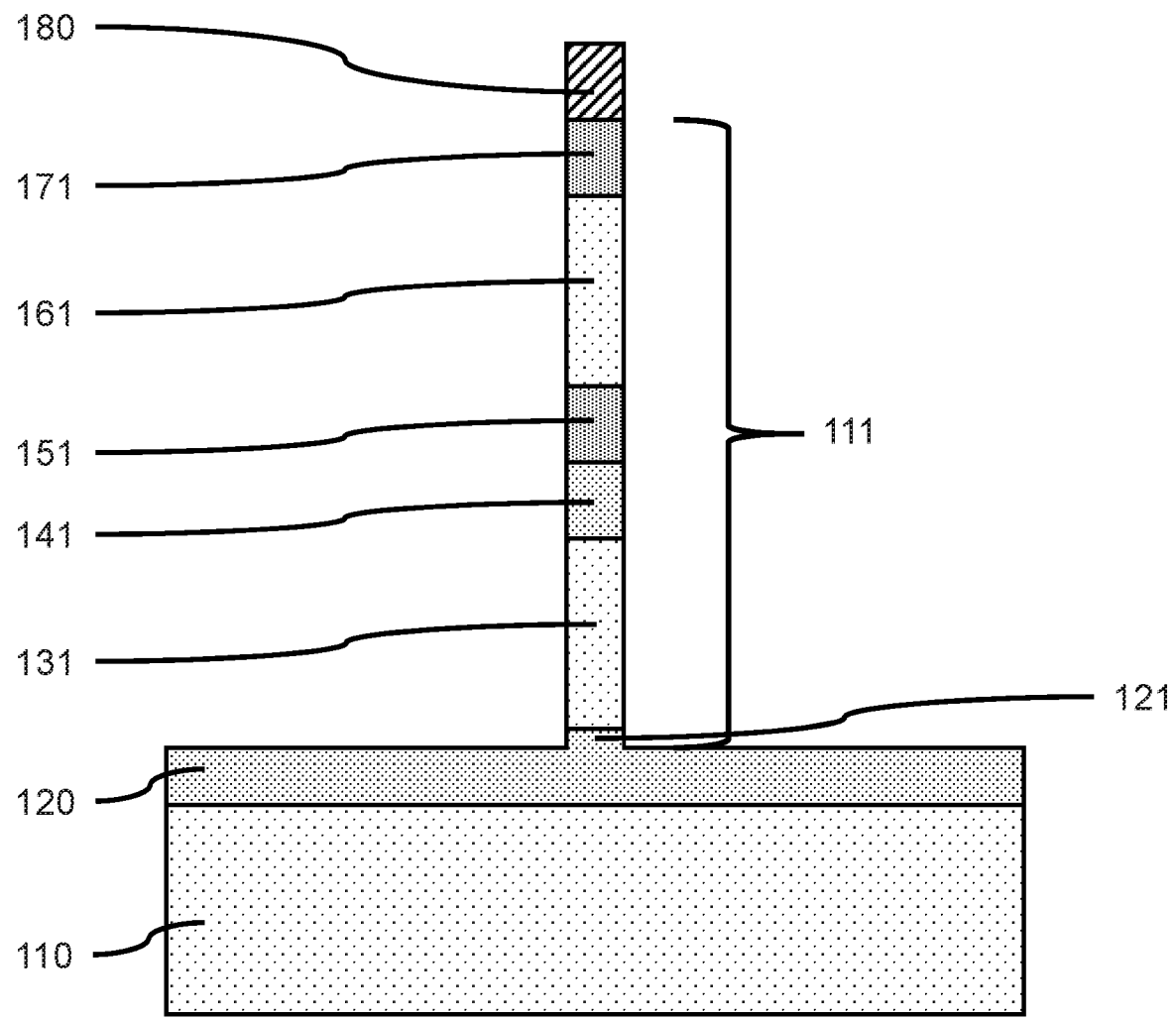
FIG. 4 is a cross-sectional side view showing a bottom PFET source/drain layer, a lower channel pillar on the bottom PFET source/drain layer, a top PFET source/drain on the lower channel pillar, a bottom NFET source/drain on the top PFET source/drain, an upper channel pillar on the bottom NFET source/drain, a top PFET source/drain on the upper channel pillar, and a fin template on the top PFET source/drain, in accordance with an embodiment of the present invention.

While the figures illustrate an embodiment with PFET layers below the NFET layers, this is for illustrative purposes only, and the order of the layers, the type of dopants, and the arrangement of the devices can be revered. Both arrangements of an NFET and PFET are considered within the scope of the present invention, and references to NFET and PFET can be reversed FIG. 4 is a cross-sectional side view showing a bottom PFET source/drain layer, a lower channel pillar on the bottom PFET source/drain layer, a top PFET source/drain on the lower channel pillar, a bottom NFET source/drain on the top PFET source/drain, an upper channel pillar on the bottom NFET source/drain, a top PFET source/drain on the upper channel pillar, and a fin template on the top PFET source/drain, in accordance with an embodiment of the present invention.

In one or more embodiments, a vertically stacked set of channel pillars and source/drains 111 can be formed on the substrate 110 by masking portions of the top NFET source/drain layer 170 and underlying layers, and removing the exposed portions of the top NFET source/drain layer 170 and the other underlying layers down to the bottom PFET source/drain layer 120, where a portion of the bottom PFET source/drain layer 120 can remain on the substrate 110 and a bottom PFET source/drain extension region 121 can be formed below a lower channel pillar 131.

In various embodiments, the vertically stacked set of channel pillars and source/drains 111 can include a bottom PFET source/drain extension region 121, a lower channel pillar 131 on the bottom PFET source/drain extension region 121, a top PFET source/drain 141 on the lower channel pillar 131, a bottom NFET source/drain 151 on the top PFET source/drain 141, an upper channel pillar 161 on the bottom NFET source/drain 151, and a top NFET source/drain 171 on the upper channel pillar 161. A fin template 180 can remain on the top NFET source/drain 171 of the stacked set of channel pillars and source/drains 111.

In one or more embodiments, the vertically stacked set of channel pillars and source/drains 111 can have a width in the range of about 4 nm to about 20 nm, or in the range of about 6 nm to about 8 nm, although other thicknesses are also contemplated.

The total height of the vertically stacked set of channel pillars and source/drains 111 can be the sum of the thickness of each of the stacked layers, where the stacked pair of channel pillars 111 can have a total height in the range of about 80 nm to about 500 nm, or in the range of about 150 nm to about 290 nm, or in the range of about 120 nm to about 180 nm, although other thicknesses are also contemplated.

In one or more embodiments, a stacked pair of channel pillars 111 can be formed on the remaining portion of the bottom PFET source/drain layer 120 and substrate 110 by a multiple patterning fabrication process, for example, a sidewall image transfer (SIT) process, a self-aligned double patterning (SADP) process, self-aligned triple patterning (SATP) process, or a self-aligned quadruple patterning (SAQP). The stacked pair of channel pillars 111 may be formed by a direct write process or double patterning process using, for example, immersion lithography, extreme ultraviolet lithography, or x-ray lithography.

Figure 5:
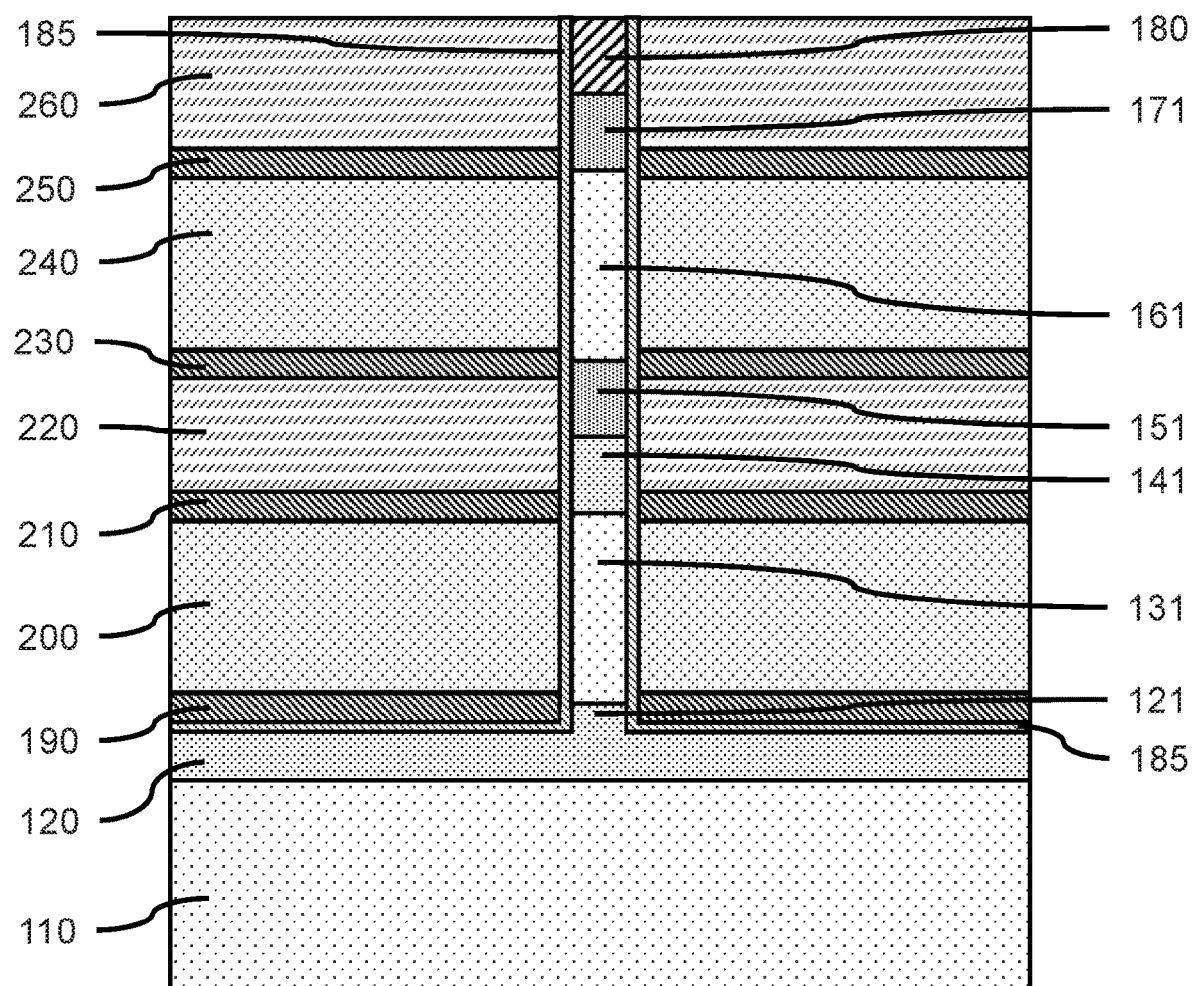
FIG. 5 is a cross-sectional side view showing a vertically stacked set of channel pillars and source/drains with a liner on the stack, a bottom spacer layer, a lower dummy gate layer, a first middle spacer layer, a gap layer, a second middle spacer layer, an upper dummy gate layer, a top spacer layer, and a cap layer, in accordance with an embodiment of the present invention.

FIG. 5 is a cross-sectional side view showing a vertically stacked set of channel pillars and source/drains with a liner on the stack, a bottom spacer layer, a lower dummy gate layer, a first middle spacer layer, a gap layer, a second middle spacer layer, an upper dummy gate layer, a top spacer layer, and a cap layer, in accordance with an embodiment of the present invention.

In one or more embodiments, a liner 185 can be formed on the stacked pair of channel pillars 111, and exposed surface of the bottom PFET source/drain layer 120, where the liner 185 can be formed by a conformal deposition, for example, atomic layer deposition (ALD) or plasma enhanced ALD (PEALD), or by a low temperature oxidation.

In one or more embodiments, the liner 185 can be made of a dielectric material, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof. The liner 185 can be selectively etchable relative to the fin template 180, channel pillars 131, 161, and source/drains 141, 151, 171.

In various embodiments, the liner 185 can have a thickness in the range of about 2 nm to about 10 nm, or in the range of about 3 nm to about 5 nm, although other thicknesses are also contemplated.

In one or more embodiments, a bottom spacer layer 190 can be formed on the liner 185, where the bottom spacer layer 190 can be formed by a directional deposition, for example, a gas cluster ion beam deposition (GCIB) or high density plasma deposition (HDP). The bottom spacer layer 190 can also be formed by a blanket deposition (e.g., CVD, PECVD, spin-on) and etched back to an intended thickness, for example, using reactive ion etching (RIE) or a wet chemical etch.

In one or more embodiments, the bottom spacer layer 190 can be made of a dielectric material, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon borocarbonitride ($Si_wB_xC_yN_z$), or combinations thereof. The bottom spacer layer 190 can be selectively etchable relative to the liner 185, fin template 180, channel pillars 131, 161, and source/drains 141, 151, 171.

In various embodiments, the bottom spacer layer 190 can have a thickness in the range of about 4 nm to about 20 nm, or in the range of about 6 nm to about 12 nm, although other thicknesses are also contemplated.

In one or more embodiments, a lower dummy gate layer 200 can be formed on the liner 185 and bottom spacer layer 190, where the lower dummy gate layer 200 can be formed by a directional deposition, for example, a gas cluster ion beam deposition (GCIB) or high density plasma deposition (HDP). The lower dummy gate layer 200 can also be formed by a blanket deposition (e.g., CVD, PECVD, spin-on) and etched back to an intended thickness, for example, using reactive ion etching (RIE) or a wet chemical etch.

In one or more embodiments, the lower dummy gate layer 200 can be made of a semiconductor material, for example, amorphous silicon (a-Si), an insulator, for example, a spin-on glass, or an amorphous carbon (a-C), or combinations thereof. The lower dummy gate layer 200 can be selectively etchable relative to the liner 185 and bottom spacer layer 190.

In various embodiments, the lower dummy gate layer 200 can have a thickness in the range of about 10 nm to about 50 nm, or in the range of about 15 nm to about 30 nm, although other thicknesses are also contemplated. The lower dummy gate layer 200 can have a thickness less than or equal to the thickness of the lower channel pillar 131, where the top surface of the lower dummy gate layer can be coplanar with or below the bottom surface of the top PFET source/drain 141, and the bottom surface of the lower dummy gate layer can be coplanar with or above the top surface of bottom PFET source/drain extension region 121.

In one or more embodiments, a first middle spacer layer 210 can be formed on the lower dummy gate layer 200 and liner 185, where the first middle spacer layer 210 can be formed by a directional deposition, for example, a gas cluster ion beam deposition (GCIB) or high density plasma deposition (HDP). The first middle spacer layer 210 can also be formed by a blanket deposition (e.g., CVD, PECVD, spin-on) and etched back to an intended thickness, for example, using reactive ion etching (RIE) or a wet chemical etch.

In one or more embodiments, the first middle spacer layer 210 can be made of a dielectric material (e.g., silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon borocarbonitride ($Si_wB_xC_yN_z$), or combinations thereof). The first middle spacer layer 210 can be selectively etchable relative to the liner 185 and lower dummy gate layer 200.

In various embodiments, the first middle spacer layer 210 can have a thickness in the range of about 4 nm to about 20 nm, or in the range of about 6 nm to about 12 nm, although other thicknesses are also contemplated.

In one or more embodiments, a gap layer 220 can be formed on the first middle spacer layer 210 and liner 185, where the gap layer 220 can be formed by a directional deposition, for example, a gas cluster ion beam deposition (GCIB) or high density plasma deposition (HDP). The gap layer 220 can also be formed by a blanket deposition (e.g., CVD, PECVD, spin-on) and etched back to an intended thickness, for example, using reactive ion etching (RIE) or a wet chemical etch.

In one or more embodiments, a gap layer 220 can be made of a dielectric material (e.g., $SiO_x$, $SiXN_y$, $Si_xO_yN_z$, $Si_xC_yN_z$, $Si_xB_yN_z$, $Si_xB_yC_z$, $Si_wB_xC_yN_z$, or combinations thereof). The gap layer 220 can be selectively etchable relative to the liner 185 and first middle spacer layer 210.

In various embodiments, the gap layer 220 can have a thickness in the range of about 40 nm to about 200 nm, or in the range of about 50 nm to about 120 nm, although other thicknesses are also contemplated.

In one or more embodiments, a second middle spacer layer 230 can be formed on the gap layer 220 and liner 185, where the second middle spacer layer 230 can be formed by a directional deposition (e.g., GCIB, HDP). The second middle spacer layer 230 can also be formed by a blanket deposition (e.g., CVD, PECVD, spin-on) and etched back to an intended thickness, for example, using reactive ion etching (RIE) or a wet chemical etch.

In one or more embodiments, the second middle spacer layer 230 can be made of a dielectric material, including, but not limited to, $SiO_x$, $SiXN_y$, $Si_xO_yN_z$, $Si_xC_yN_z$, $Si_xB_yN_z$, $Si_xB_yC_z$, $Si_wB_xC_yN_z$, or combinations thereof. The second middle spacer layer 230 can be selectively etchable relative to the liner 185 and gap layer 220.

In various embodiments, the second middle spacer layer 230 can have a thickness in the range of about 4 nm to about 20 nm, or in the range of about 6 nm to about 12 nm, although other thicknesses are also contemplated.

In a non-limiting exemplary embodiment, the first middle spacer layer 210 can be a dielectric nitride (e.g., $Si_xN_y$), the gap layer 220 can be a dielectric oxide (e.g., $SiO_x$), and the second middle spacer layer 230 can be a dielectric nitride (e.g., $Si_xN_y$).

In one or more embodiments, an upper dummy gate layer 240 can be formed on the liner 185 and second middle spacer layer 230, where the upper dummy gate layer 240 can be formed by a directional deposition (e.g., GCIB or HDP). The upper dummy gate layer 240 can also be formed by a blanket deposition (e.g., CVD, PECVD, spin-on) and etched back to an intended thickness, for example, using reactive ion etching (RIE) or a wet chemical etch.

In one or more embodiments, the upper dummy gate layer 240 can be made of a semiconductor material, for example, amorphous silicon (a-Si), an insulator, for example, a spin-on glass, or an amorphous carbon (a-C), or combinations thereof. The upper dummy gate layer 240 can be selectively etchable relative to the liner 185 and second middle spacer layer 230.

In various embodiments, the upper dummy gate layer 240 can have a thickness in the range of about 10 nm to about 50 nm, or in the range of about 15 nm to about 30 nm, although other thicknesses are also contemplated. The upper dummy gate layer 240 can have a thickness less than or equal to the thickness of the upper channel pillar 161, where the top surface of the upper dummy gate layer 240 can be coplanar with or below the bottom surface of the top NFET source/drain 171, and the bottom surface of the upper dummy gate layer can be coplanar with or above the top surface of bottom NFET source/drain 151.

In one or more embodiments, a top spacer layer 250 can be formed on the upper dummy gate layer 240 and liner 185, where the top spacer layer 250 can be formed by a directional deposition, for example, a gas cluster ion beam deposition (GCIB) or high density plasma deposition (HDP). The top spacer layer 250 can also be formed by a blanket deposition (e.g., CVD, PECVD, spin-on) and etched back to an intended thickness, for example, using reactive ion etching (RIE) or a wet chemical etch.

In one or more embodiments, the top spacer layer 250 can be made of a dielectric material, including, but not limited to, $SiO_x$, $SiXN_y$, $Si_xO_yN_z$, $Si_xC_yN_z$, $Si_xB_yN_z$, $Si_xB_yC_z$, $Si_wB_xC_yN_z$, or combinations thereof. The top spacer layer 250 can be selectively etchable relative to the liner 185 and upper dummy gate layer 240.

In various embodiments, the top spacer layer 250 can have a thickness in the range of about 4 nm to about 20 nm, or in the range of about 6 nm to about 12 nm, although other thicknesses are also contemplated.

In one or more embodiments, a cap layer 260 can be formed on the top spacer layer 250 and liner 185, where the cap layer 260 can be formed by a directional deposition (e.g., GCIB, HDP). The cap layer 260 can also be formed by a blanket deposition (e.g., CVD, PECVD, spin-on) and etched back to an intended thickness, for example, using reactive ion etching (RIE) or a wet chemical etch.

In one or more embodiments, a cap layer 260 can be made of a dielectric material (e.g., $SiO_x$, $SiXN_y$, $Si_xO_yN_z$, $Si_xC_yN_z$, $Si_xB_yN_z$, $Si_xB_yC_z$, $Si_wB_xC_yN_z$, or combinations thereof). The cap layer 260 can be selectively etchable relative to the liner 185 and top spacer layer 250.

In various embodiments, the cap layer 260 can have a thickness in the range of about 30 nm to about 250 nm, or in the range of about 50 nm to about 150 nm, although other thicknesses are also contemplated.

In various embodiments, a portion of the cap layer 260 extending above the liner 185 and fin template 180 can be removed using chemical-mechanical polishing (CMP) to provide a smooth, flat surface, where the portion of the liner 185 on the top surface of the fin template 180 can also be removed to expose the fin template. The cap layer 260 can cover the underlying structure and provide a reference surface for subsequent processing.

Figure 6:
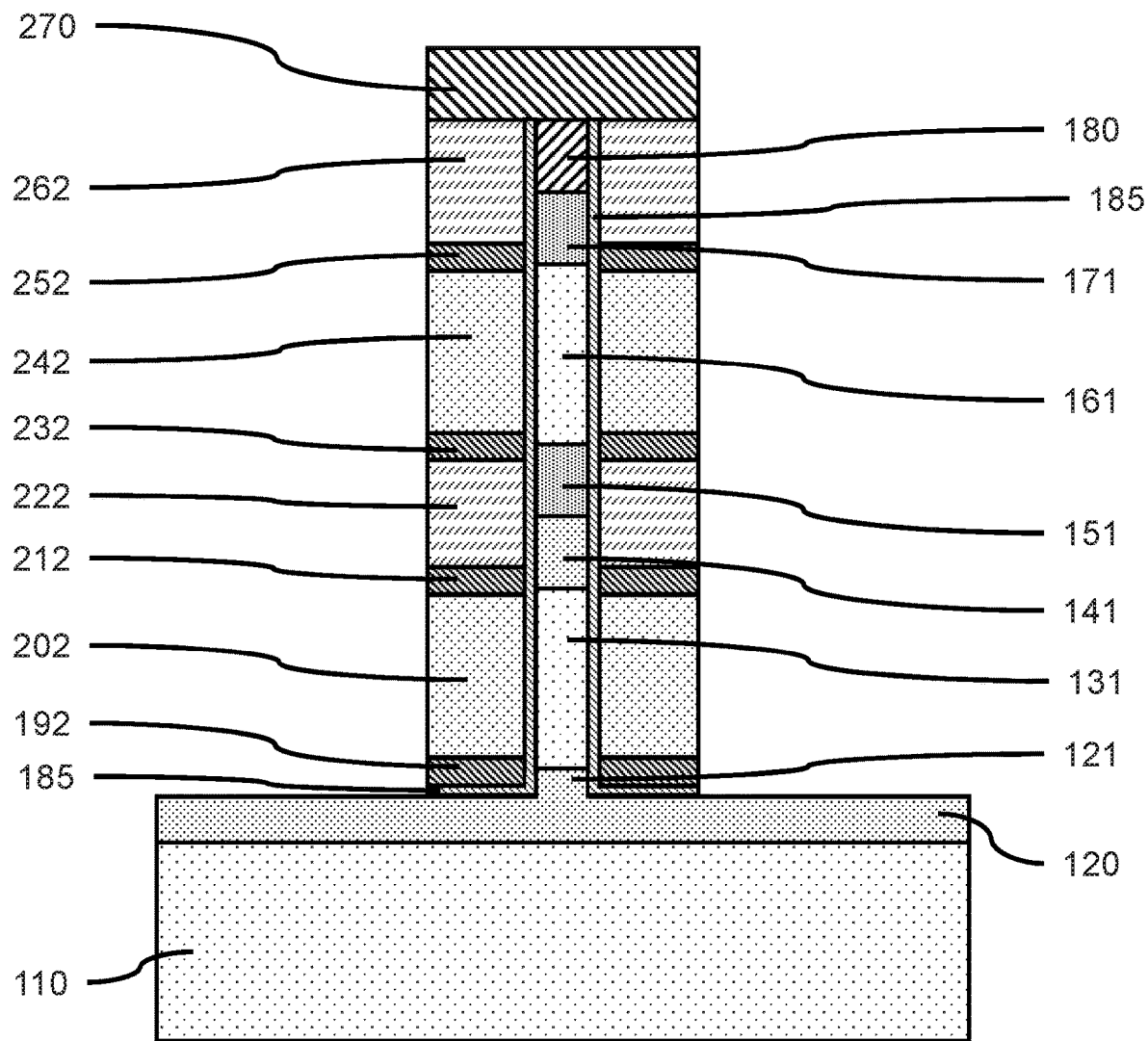
FIG. 6 is a cross-sectional side view showing a vertically stacked set of channel pillars and source/drains with a liner on the stack, a bottom spacer, a lower dummy gate plug, a first middle spacer, a middle gap plug, a second middle spacer, an upper dummy gate plug, a top spacer, and a cap plug, in accordance with an embodiment of the present invention.

FIG. 6 is a cross-sectional side view showing a vertically stacked set of channel pillars and source/drains with a liner on the stack, a bottom spacer, a lower dummy gate plug, a first middle spacer, a middle gap plug, a second middle spacer, an upper dummy gate plug, a top spacer, and a cap plug, in accordance with an embodiment of the present invention.

In one or more embodiments, a gate mask 270 can be formed on the fin template 180, cap layer 260, and underlying layers, where the gate mask 270 can be a hardmask, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon borocarbonitride ($Si_wB_xC_yN_z$), or combinations thereof. The gate mask 270 can protect the underlying material layers during removal of portions of the dummy gate layers, spacer layers, and a later formed gate fill layer that extend laterally beyond the gate mask 270.

In one or more embodiments, a directional etch (e.g., RIE) can be used to remove the exposed portions of the bottom spacer layer 190, lower dummy gate layer 200, first middle spacer layer 210, gap layer 220, second middle spacer layer 230, upper dummy gate layer 240, top spacer layer 250, and cap layer 260 to form a bottom spacer 192, a lower dummy gate plug 202, a first middle spacer 212, a middle gap plug 222, a second middle spacer 232, an upper dummy gate plug 242, a top spacer 252, and a cap plug 262 on the liner 185 and sidewalls of the stacked pair of channel pillars 111.

In various embodiments, a portion of the liner 185 can be removed from the surface of the bottom PFET source/drain layer 120 to form liner segments below the bottom spacer 192.

Figure 7:
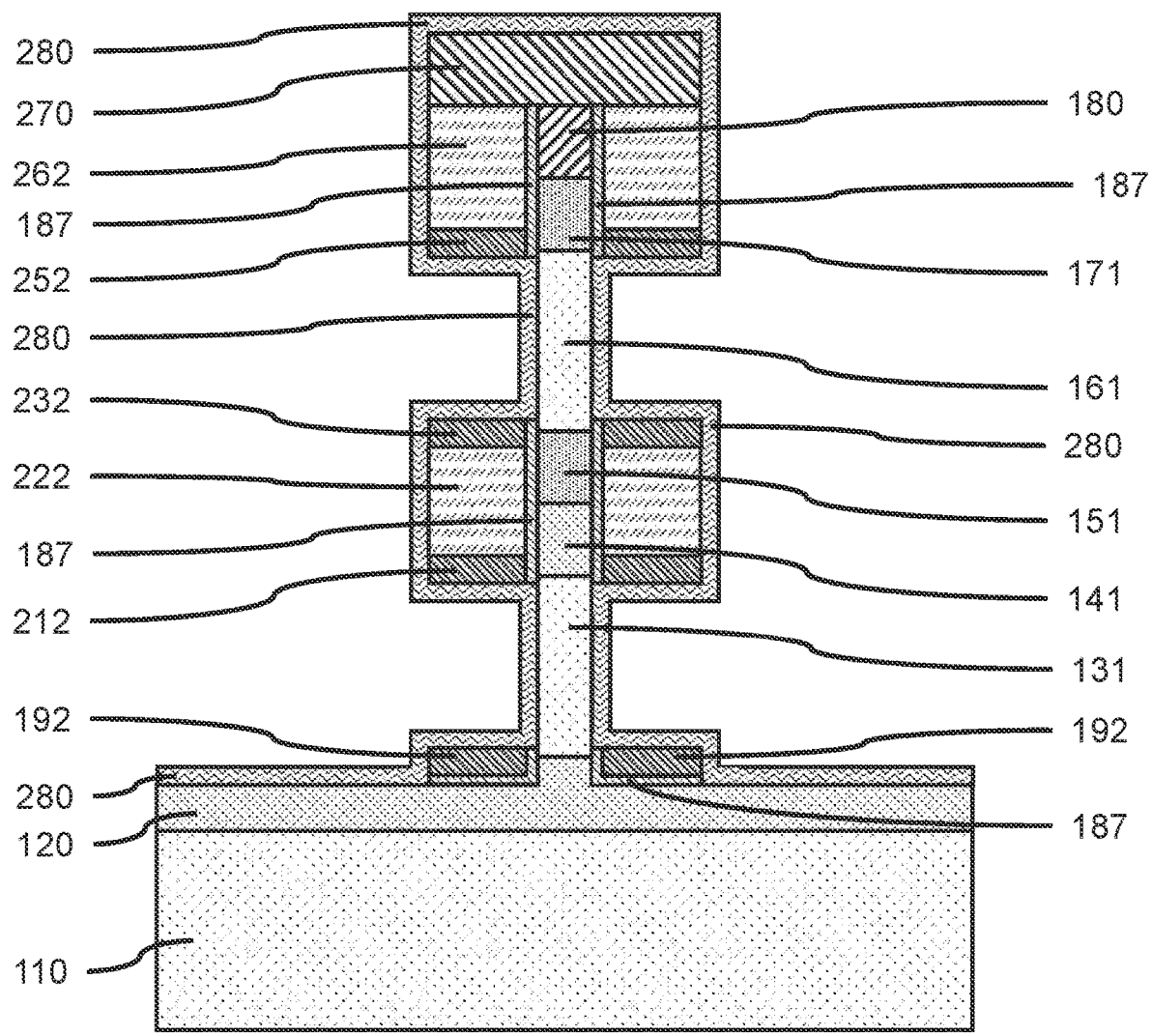
FIG. 7 is a cross-sectional side view showing a vertically stacked set of channel pillars and source/drains with liner segments on the stack after removing the lower dummy gate plug and upper dummy gate plug, and a gate dielectric layer on the lower channel pillar and upper channel pillar, in accordance with an embodiment of the present invention.

FIG. 7 is a cross-sectional side view showing a vertically stacked set of channel pillars and source/drains with liner segments on the stack after removing the lower dummy gate plug and upper dummy gate plug, and a gate dielectric layer on the lower channel pillar and upper channel pillar, in accordance with an embodiment of the present invention.

In one or more embodiments, the lower dummy gate plug 202 and upper dummy gate plug 242 can be removed, where the lower dummy gate plug 202 and upper dummy gate plug 242 can be removed using an isotropic etch, for example, a wet chemical etch or dry plasma etch. Removing the lower dummy gate plug 202 and upper dummy gate plug 242 can expose portions of the liner 185 on the lower channel pillar 131 and upper channel pillar 161. In various embodiments, the exposed portions of the liner 185 can be removed to expose the sidewalls of the lower channel pillar 131 and upper channel pillar 161. Liner segments 187 can remain on portions of the bottom NFET source/drain 151 and the top PFET source/drain 141, and on portions of the top NFET source/drain 171 and fin template 180.

In one or more embodiments, a gate dielectric layer 280 can be formed on the exposed portions of the lower channel pillar 131 and upper channel pillar 161, and other exposed surfaces, where the gate dielectric layer 280 can be formed by conformal depositions (e.g., ALD, PEALD).

In one or more embodiments, a gate dielectric layer 280 can be silicon oxide ($SiO_x$), silicon nitride ($Si_xN_y$), silicon oxynitride ($Si_xO_yN_z$), boron nitride (BN), high-k dielectric materials, or a combination thereof. Examples of high-k materials include but are not limited to metal oxides, such as, hafnium oxide ($HfO_x$), hafnium silicon oxide ($Hf_xSi_yO_z$), hafnium silicon oxynitride ($Hf_wSi_xO_yN_z$), lanthanum oxide ($LaO_x$), lanthanum aluminum oxide ($La_xAl_yO_z$), zirconium oxide ($ZrO_x$), zirconium silicon oxide ($Zr_xSi_yO_z$), zirconium silicon oxynitride ($Zr_wSi_xO_yN_z$), tantalum oxide ($TaO_x$), titanium oxide ($TiO_x$), barium strontium titanium oxide ($Ba_wSr_xTi_yO_z$), barium titanium oxide ($Ba_xTi_yO_z$), strontium titanium oxide ($Sr_xTi_yO_z$), yttrium oxide ($Y_xO_y$), aluminum oxide ($Al_xO_y$), lead scandium tantalum oxide ($Pb_wSc_xTa_yO_z$), and lead zinc niobate ($Pb_wZn_xNb_yO_z$). The high-k material may further include dopants such as lanthanum, aluminum, magnesium, or combinations thereof.

In various embodiments, the gate dielectric layer 280 can have a thickness in the range of about 10 nm to about 50 nm, or about 15 nm to about 40 nm, or about 20 nm to about 30 nm, although other thicknesses are contemplated. The gate dielectric layer 280 can have a thickness sufficient to maintain an electrical charge above a minimum value for a predetermined period of time based on the rate of charge loss through tunneling.

Figure 8:
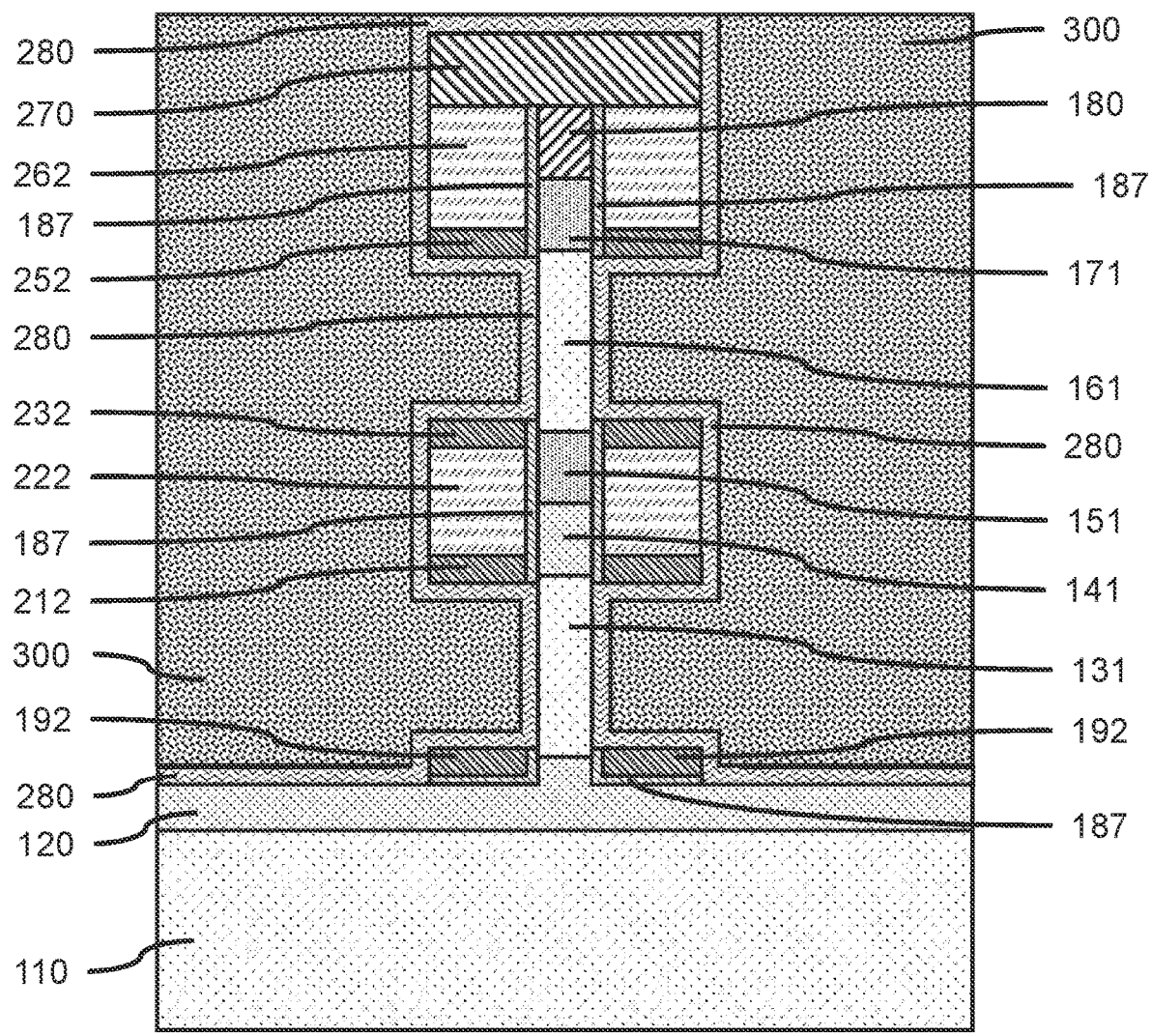
FIG. 8 is a cross-sectional side view showing a vertically stacked set of channel pillars and source/drains with a gate fill layer on the gate dielectric layer, in accordance with an embodiment of the present invention.

FIG. 8 is a cross-sectional side view showing a vertically stacked set of channel pillars and source/drains with a gate fill layer on the gate dielectric layer, in accordance with an embodiment of the present invention.

In one or more embodiments, a gate fill layer 300 can be formed on the gate dielectric layer 280, where the gate fill layer 300 can be formed by a conformal deposition (e.g., ALD, PEALD), CVD, PECVD, MOCVD, physical vapor deposition (PVD), or a combination thereof. A CMP can be used to remove excess gate fill layer 300, and provide a smooth, flat surface.

The gate fill layer 300 can be made of a conductive material, which can be polysilicon (p-Si), a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), a copper manganese alloy (Cu—Mn), or any suitable combination thereof.

Figure 9:
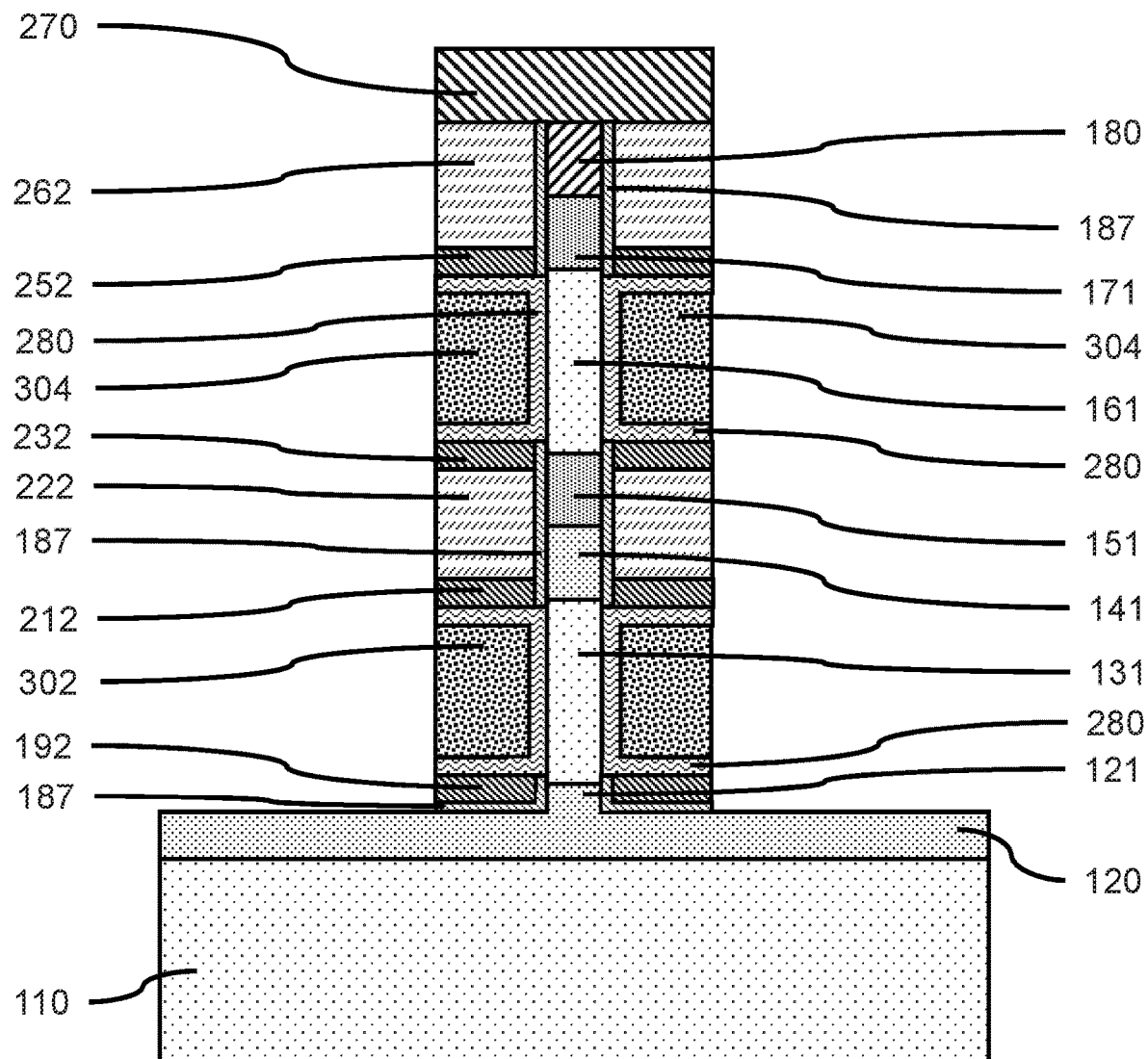
FIG. 9 is a cross-sectional side view showing a vertically stacked set of channel pillars and source/drains with a lower gate structure on the lower channel pillar, and an upper gate structure on the upper channel pillar, in accordance with an embodiment of the present invention.

FIG. 9 is a cross-sectional side view showing a vertically stacked set of channel pillars and source/drains with a lower gate structure on the lower channel pillar, and an upper gate structure on the upper channel pillar, in accordance with an embodiment of the present invention.

In one or more embodiments, a portion of the gate fill layer 300 not covered by the top spacer 252, cap plug 262, and gate mask 270 can be removed, where the portion of the gate fill layer 300 in the recessed areas under the top spacer 252 and a cap plug 262 can remain to form an upper gate electrode 304 of an upper gate structure for an NFET. The portion of the gate fill layer 300 in the recessed areas under the first middle spacer 212, middle gap plug 222, and second middle spacer 232 can remain to form a lower gate electrode 302 of lower gate structure for a PFET. The portion of the gate fill layer 300 not covered by the cap plug 262 can be removed using a directional etch (e.g., RIE).

In one or more embodiments, an upper portion of the bottom PFET source/drain layer 120 can be partially removed during removal of the gate fill layer 300 and gate dielectric layer 280.

In one or more embodiments, the exposed portions of the gate dielectric layer 280 can be removed from the cap plug 262, top spacer 252, first middle spacer 212, middle gap plug 222, second middle spacer 232, and bottom spacer 192 during removal of portions of the gate fill layer 300. The gate dielectric layer 280 can also be removed from the bottom PFET source/drain layer 120. A portion of the gate dielectric layer 280 can remain on the bottom spacer 192, lower channel pillar 131, and first middle spacer 212 forming a lower gate structure dielectric layer 282 on the lower channel pillar 131. A portion of the gate dielectric layer 280 can remain on the second middle spacer 232, upper channel pillar 161, and top spacer 252 forming an upper gate structure dielectric layer 284 on the upper channel pillar 161.

In a non-limiting exemplary embodiment, the lower gate structure dielectric layer 282 and upper gate structure dielectric layer 284 can be silicon nitride ($Si_xN_y$) (e.g., $Si_3N_4$), yttrium oxide ($Y_xO_y$) (e.g., $Y_2O_3$), zirconium oxide ($ZrO_x$) (e.g., $ZrO_2$), or hafnium oxide ($HfO_x$) (e.g., $HfO_2$).

In various embodiments, removal of portions of the gate dielectric layer 280 can expose the cap plug 262 and middle gap plug 222.

Figure 10:
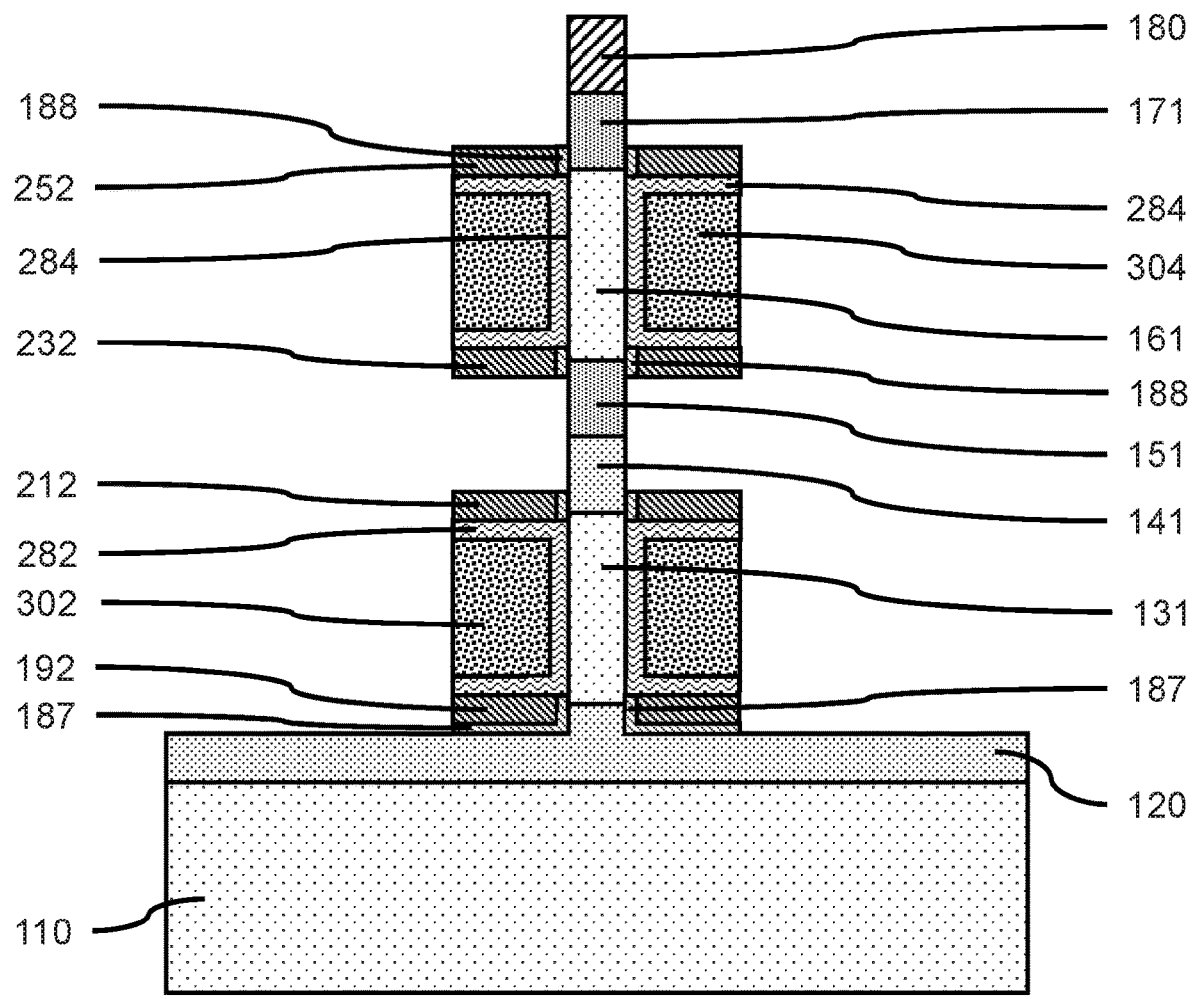
FIG. 10 is a cross-sectional side view showing a top PFET source/drain, a bottom NFET source/drain, a top NFET source/drain, and a fin template partially exposed after removing the gate mask, middle gap plug, and cap plug, in accordance with an embodiment of the present invention.

FIG. 10 is a cross-sectional side view showing a top PFET source/drain, a bottom NFET source/drain, a top NFET source/drain, and a fin template partially exposed after removing the gate mask, middle gap plug, and cap plug, in accordance with an embodiment of the present invention.

In one or more embodiments, the cap plug 262 and middle gap plug 222 can be removed using an isotropic etch to expose the underlying portions of the liner segments 187. In various embodiments, portions of the liner segments 187 exposed by removal of the cap plug 262 and middle gap plug 222 can be removed using an isotropic etch to expose at least a portion of the top PFET source/drain 141 on the lower channel pillar 131, at least a portion of the bottom NFET source/drain 151 on the top PFET source/drain 141, and at least a portion of the top NFET source/drain 171 on the upper channel pillar 161. In various embodiments, the interface between the bottom NFET source/drain 151 and the top PFET source/drain 141 can be exposed.

Portions of the liner segments 187 covered by the bottom spacer 192, first middle spacer 212, second middle spacer 232, and top spacer 252 can remain as separation bands 188 on a portion of the bottom NFET source/drain 151, the top PFET source/drain 141, and the top NFET source/drain 171.

Figure 11:
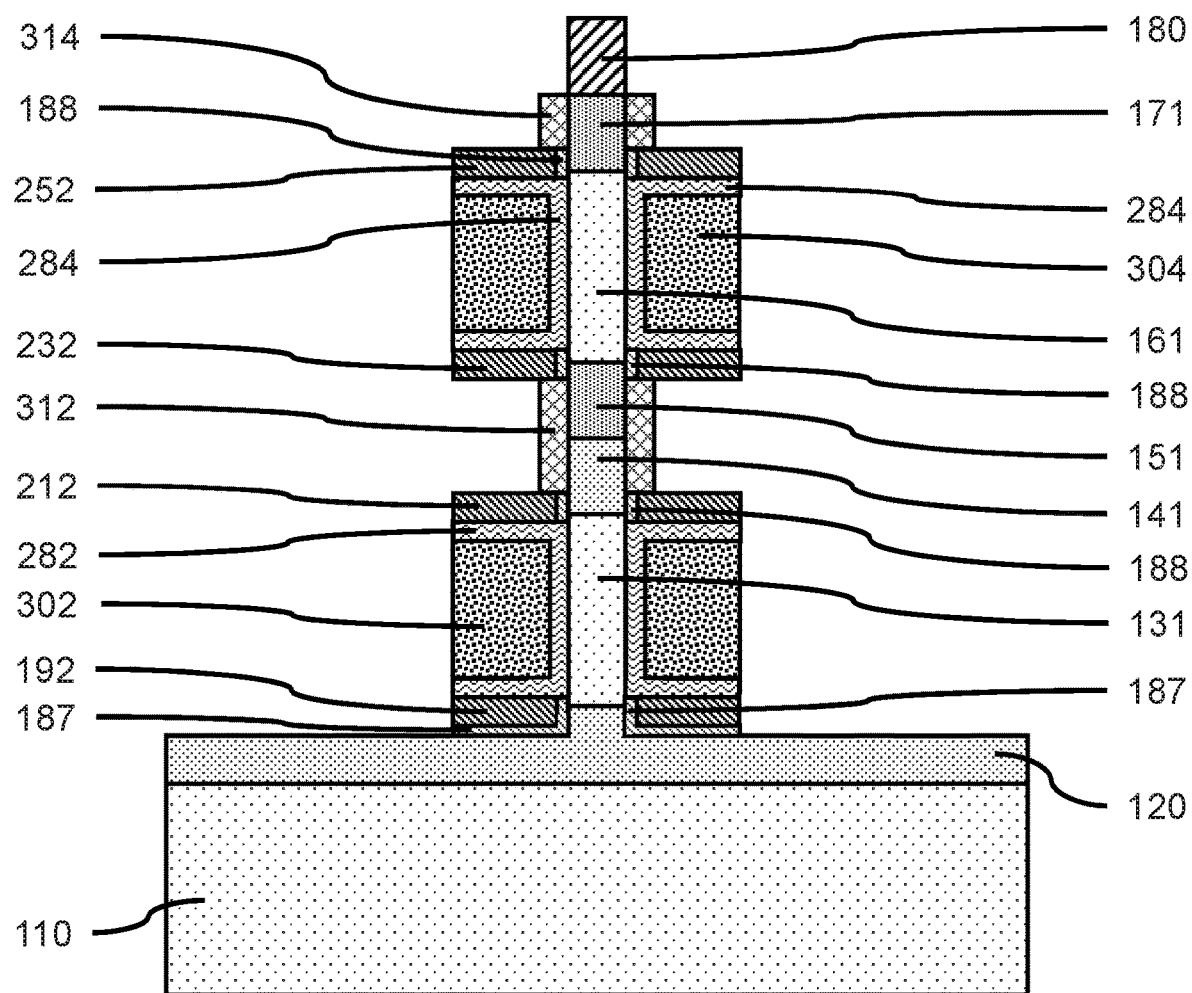
FIG. 11 is a cross-sectional side view showing a conductive strap on the top PFET source/drain and bottom NFET source/drain, and a conductive collar on the top PFET source/drain, in accordance with an embodiment of the present invention.

FIG. 11 is a cross-sectional side view showing a conductive strap on the top PFET source/drain and bottom NFET source/drain, and a conductive collar on the top PFET source/drain, in accordance with an embodiment of the present invention.

In one or more embodiments, a conductive strap 312 can be formed on the top PFET source/drain 141 and bottom NFET source/drain 151, where the conductive strap 312 can be formed by a self-aligned silicide process, where a metal forming the silicide can be conformally and/or selectively deposited (e.g., ALD) on the top PFET source/drain 141 and bottom NFET source/drain 151, and reacted with silicon to form a silicide. The conductive strap 312 can form a conductive path between the top PFET source/drain 141 and bottom NFET source/drain 151, where the conductive strap 312 can form an electrical connection to a common drain contact of the vertically stacked set 111.

In one or more embodiments, the conductive strap 312 can be made of a conductive silicide material, which can be tungsten silicide ($WSi_x$), titanium silicide ($TiSi_x$), cobalt silicide ($CoSi_x$), molybdenum silicide ($MoSi_x$), and nickel silicide ($NiSi_x$), or suitable combinations thereof.

In one or more embodiments, the conductive strap 312 can have a thickness in the range of about 6 nm to about 20 nm, or in the range of about 8 nm to about 12 nm, although other thicknesses are also contemplated. The conductive strap 312 can electrically couple the bottom NFET source/drain 151 to the top PFET source/drain 141 to provide a conductive path around the P-N junction (diode interface).

In various embodiments, the conductive strap 312 can be electrically connected to a common source/drain connection for the CMOS device. The conductive strap 312 can also provide an electrical connection to a metal line.

In one or more embodiments, a conductive collar 314 can be formed on the top NFET source/drain 171, where the conductive collar 314 can be formed by the same self-aligned silicide process as the conductive strap 312.

In various embodiments, the conductive collar 314 an be conductive silicide material (e.g., $WSi_x$, $TiSi_x$, $CoSi_x$, $MoSi_x$, and $NiSi_x$), or any suitable combination thereof. The conducting silicide material can protect the portion of the top NFET source/drain 171 above the top spacer 252 during subsequent processing.

In one or more embodiments, the conductive collar 314 can have a thickness in the range of about 6 nm to about 20 nm, or in the range of about 8 nm to about 12 nm, although other thicknesses are also contemplated.

Figure 12:
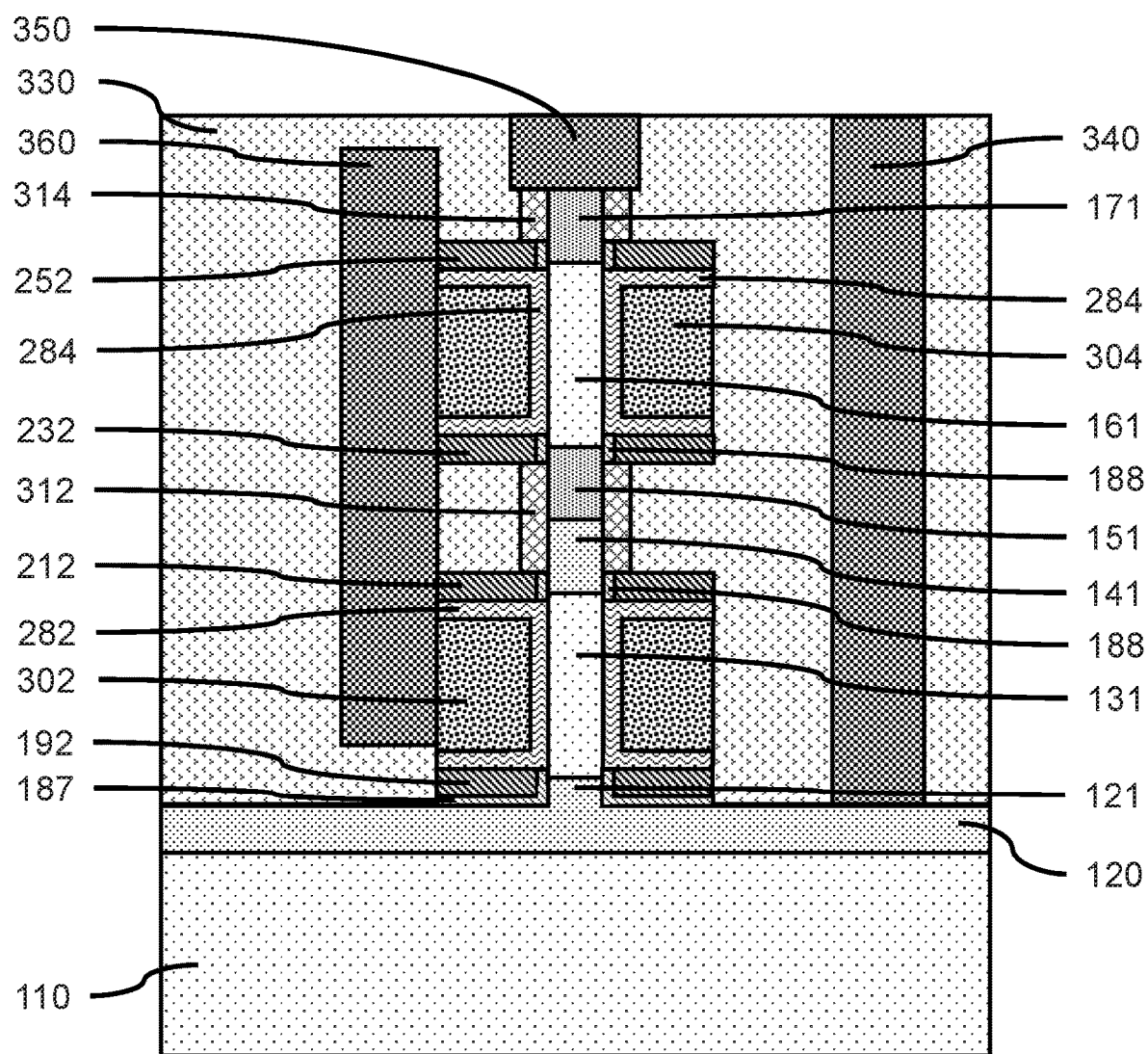
FIG. 12 is a cross-sectional side view showing stacked vertical transport field effect transistors (VT FETs) of complementary metal-oxide-semiconductor (CMOS) devices forming an electrically erasable programmable read-only memory (EEPROM), in accordance with an embodiment of the present invention.

FIG. 12 is a cross-sectional side view showing stacked vertical transport field effect transistors (VT FETs) of a complementary metal-oxide-semiconductor devices forming an electrically erasable programmable read-only memory (EEPROM), in accordance with an embodiment of the present invention.

In one or more embodiments, an interlayer dielectric (ILD) layer 330 can be formed on the gate structures, including the lower gate electrode 302 and lower gate structure dielectric layer 282 on the lower channel pillar 131, and the upper gate electrode 304 and upper gate structure dielectric layer 284 on the upper channel pillar 161. The interlayer dielectric (ILD) layer 330 can be formed by a blanket deposition, where the ILD layer can fill in the recesses between the first middle spacer 212 and second middle spacer 232 adjacent to the conductive strap 312.

In one or more embodiments, the interlayer dielectric (ILD) layer 330 can be made of silicon oxide ($SiO_x$) (e.g., $SiO_2$), a low-K material, or a combination thereof. A low-K dielectric can include amorphous carbon (a-C), fluorine doped silicon oxide ($SiO_x$:F), carbon doped silicon oxide ($SiO_x$:C), $Si_xC_yO_zH$, silicon borocarbonitride ($Si_wB_xC_yN_z$), or a combination thereof.

In one or more embodiments, electrical contacts 340, 350, 360, can be formed to the bottom PFET source/drain layer 120, top NFET source/drain 171, lower gate electrode 302 and common upper gate electrode 304. The common electrical contact 360 formed to the lower gate electrode 302 and upper gate electrode 304 can provide a floating electrical connection between the lower gate electrode 302 and upper gate electrode 304, where the common electrical contact 360 is not electrically connected to a voltage source, current source, or ground.

Figure 13:
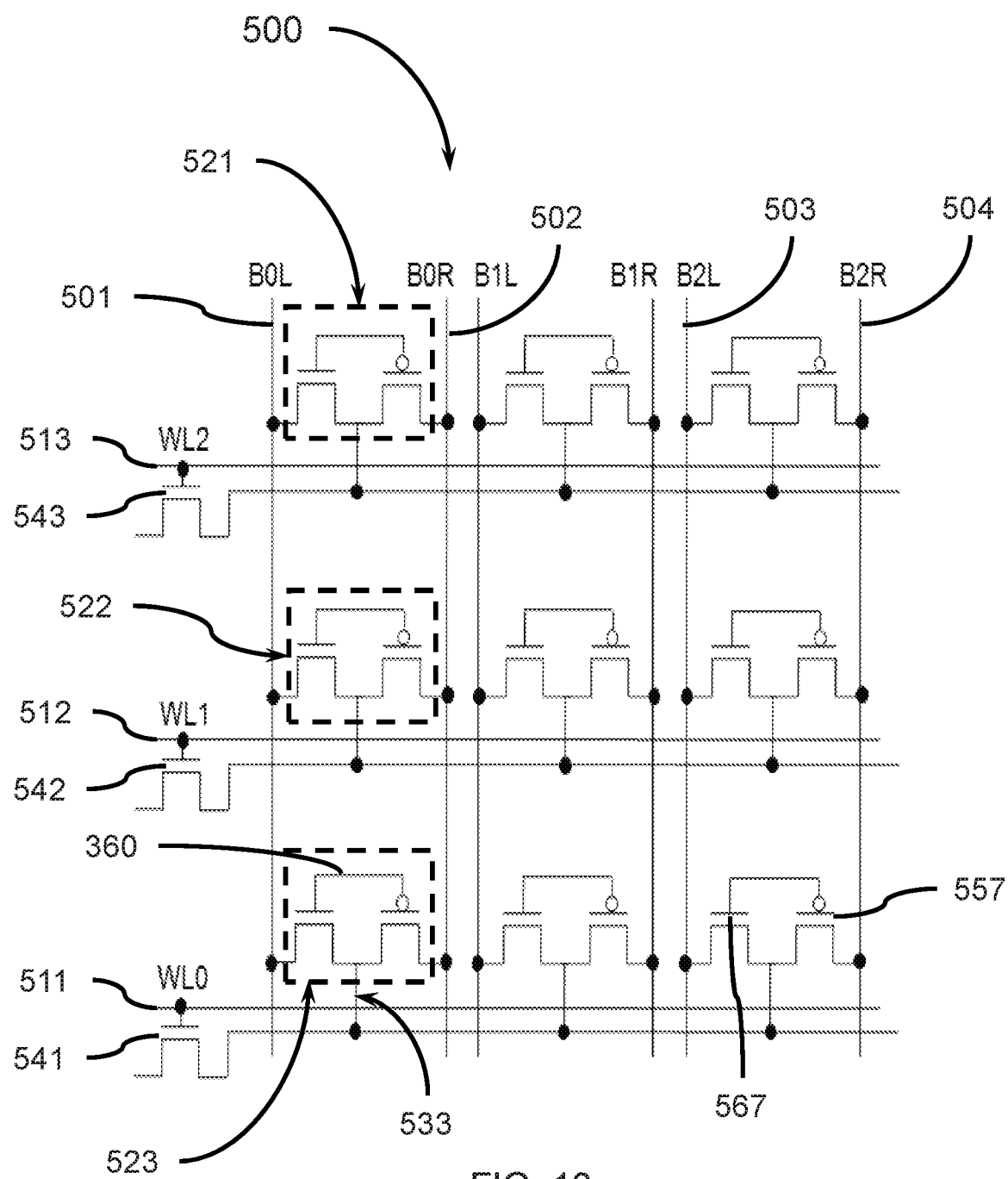
FIG. 13 is a diagram of an EEPROM array formed by a plurality of stacked vertical transport field effect transistors with common floating gates.

FIG. 13 is a diagram of an EEPROM Array formed by a plurality of stacked vertical transport field effect transistors with common floating gates.

In one or more embodiments, a plurality of stacked vertical transport field effect transistors (VT FETs) 521, 522, 523 can form an EEPROM array 500, where the stacked VT FETs can include an n-type vertical transport field effect transistor and a p-type vertical transport field effect transistor collinear with one another.

The EEPROM array 500 can include a plurality of bit lines 501, 502, 503, 504, and word lines 511, 512, 513, with one access transistor 541, 542, 543 per wordline, WL0, WL1, WL2. A conductive strap 312 can form an electrical connection to a common drain contact 533 of a stacked vertical transport field effect transistor (VT FET) 523. The common electrical contact 360 can electrically connect the lower gate electrode 302 with the upper gate electrode 304.

EEPROM cells and memory arrays employing common-floating-gate parallel-nFET-pFET devices can have efficient avalanche hot-electron injection in PFET 557 and efficient avalanche hot-hole injection in the NFET 567. The parallel-nFET-pFET devices can be programmed through avalanche hot-electron injection into the floating gate through the PFET 557 to place a negative voltage on the floating gate. The parallel-nFET-pFET devices can be erased through avalanche hot-hole injection into the floating gate through the NFET 567 to remove the negative charge and/or place a positive voltage on the floating gate. A negative charge accumulated on the floating gate can be sufficient to turn off the conduction of an enhancement mode NFET 567. A positive charge accumulated on the floating gate can be sufficient to turn off the conduction of a PFET 557. The charge injection and removal can be determined by the voltage drop between the drain and gate terminals. In various embodiments, a memory cell can utilize enhancement mode NFET 567 and PFET 557 devices, where the memory cell can be programmed by avalanche hot-electron injection and avalanche hot-hole injection.

In operation, the common floating gate connected by electrical contact 360 can be programmed by avalanche hot-electron injection from the PFET to write a "1", and avalanche hot-hole injection from the NFET to write a "0". The voltage difference between bitline B0L and bitline B0R is divided between NFET and PFET, such that Vds across either NFET or PFET is not large enough to cause hot-carrier injection. In writing a "1", Vds=−3.0 V across the floating-gate pFET, causing hot-electron injection into the pFET. For example, for stacked vertical transport field effect transistor (VT FET) 523 a WL0 voltage of 1.5 V and −3 V on B0R can write a "1" to the PFET.

In writing a "0", Vds=3.0 V across the nFET, causing hot-hole injection in the NFET.

In reading the NFET, Vds=1.5 V across both the NFET and the PFET.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another elements) or feat s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It will also be understood that, although the terms first, second, etc. can be used herein to describe various elements, these elements should not be limited by these terms. These terms are only used to distinguish one element from another element. Thus, a first element discussed below could be termed a second element without departing from the scope of the present concept. Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertically stacked set of an n-type vertical transport field effect transistor (n-type VT FET) and a p-type vertical transport field effect transistor (p-type VT FET), comprising:
    a vertically stacked set of channel pillars and source/drains on a substrate, wherein a source/drain of the n-type VT FET and a source/drain of the p-type VT FET form a P-N junction;
    a conductive strap on at least a portion of the source/drain of the n-type VT FET and at least a portion of the p-type VT FET, wherein the conductive strap forms a conductive path around the P-N junction;
    a lower gate structure dielectric layer on a lower channel pillar of the vertically stacked set of channel pillars and source/drains; and
    an upper gate structure dielectric layer on an upper channel pillar of the vertically stacked set of channel pillars and source/drains.

2. The vertically stacked set of the n-type VT FET and the p-type VT FET of claim 1, further comprising a bottom source/drain extension region between the lower channel pillar and the substrate.

3. The vertically stacked set of the n-type VT FET and the p-type VT FET of claim 1, further comprising a first middle spacer between the conductive strap and the lower gate structure dielectric layer.

4. The vertically stacked set of the n-type VT FET and the p-type VT FET of claim 3, further comprising a second middle spacer between the conductive strap and the upper gate structure dielectric layer.

5. The vertically stacked set of the n-type VT FET and the p-type VT FET of claim 1, further comprising a conductive collar on a top source/drain on the upper channel pillar, wherein the lower channel pillar and upper channel pillar are undoped silicon.

6. The vertically stacked set of the n-type VT FET and the p-type VT FET of claim 5, wherein the conductive strap is a conductive metal silicide on a first top source/drain of the p-type VT FET and a second bottom source/drain of the n-type VT FET of the vertically stacked set of channel pillars and source/drains.

7. The vertically stacked set of the n-type VT FET and the p-type VT FET of claim 6, wherein the second bottom source/drain and a second top source/drain of the vertically stacked set of channel pillars and source/drains are made of a material selected from the group consisting of silicon and carbon-doped silicon.

8. The vertically stacked set of the n-type VT FET and the p-type VT FET of claim 7, wherein the vertically stacked sets of channel pillars and source/drains has a height in a range of about 80 nm to about 500 nm.

9. A vertically stacked set of an n-type vertical transport field effect transistor (n-type VT FET) and a p-type vertical transport field effect transistor (p-type VT FET), comprising:
   a first bottom source/drain layer on a substrate, wherein the first bottom source/drain layer has a first conductivity type;
   a lower channel pillar on the first bottom source/drain layer;
   a bottom source/drain extension region between the lower channel pillar and the first bottom source/drain layer;
   a first top source/drain on the lower channel pillar, wherein the first top source/drain has the first conductivity type;
   a second bottom source/drain on the first top source/drain, wherein the second bottom source/drain has a second conductivity type different from the first conductivity type;
   a conductive strap of a metal silicide on the first top source/drain and second bottom source/drain;
   an upper channel pillar on the second bottom source/drain; and
   a second top source/drain on the upper channel pillar, wherein the second top source/drain has the second conductivity type different from the first conductivity type.

10. The vertically stacked set of the n-type VT FET and the p-type VT FET of claim 9, wherein the first bottom source/drain layer and first top source/drain are made of a material selected from the group consisting of silicon and silicon-germanium.

11. The vertically stacked set of the n-type VT FET and the p-type VT FET of claim 9, wherein the second bottom source/drain layer and second top source/drain are made of a material selected from the group consisting of silicon and carbon-doped silicon.

12. The vertically stacked set of the n-type VT FET and the p-type VT FET of claim 9, wherein the lower channel pillar and upper channel pillar are undoped silicon.

13. The vertically stacked set of the n-type VT FET and the p-type VT FET of claim 9, wherein the first bottom source/drain layer has a thickness in the range of about 20 nanometers (nm) to about 100 nm.

14. The vertically stacked set of the n-type VT FET and the p-type VT FET of claim 9, further comprising a lower gate structure dielectric layer on the lower channel pillar.

15. The vertically stacked set of the n-type VT FET and the p-type VT FET of claim 14, further comprising an upper gate structure dielectric layer on the upper channel pillar.

16. The vertically stacked set of the n-type VT FET and the p-type VT FET of claim 15, further comprising a first middle spacer between the conductive strap and the lower gate structure dielectric layer.

17. The vertically stacked set of the n-type VT FET and the p-type VT FET of claim 16, further comprising a second middle spacer between the conductive strap and the upper gate structure dielectric layer.

18. A vertically stacked set of an n-type vertical transport field effect transistor (n-type VT FET) and a p-type vertical transport field effect transistor (p-type VT FET), comprising:
   a first bottom source/drain layer on a substrate, wherein the first bottom source/drain layer has a first conductivity type;
   a lower channel pillar on the first bottom source/drain layer;
   a bottom source/drain extension region between the lower channel pillar and the first bottom source/drain layer;
   a first top source/drain on the lower channel pillar, wherein the first top source/drain has the first conductivity type;
   a second bottom source/drain on the first top source/drain, wherein the second bottom source/drain has a second conductivity type different from the first conductivity type;
   a conductive strap of a metal silicide on the first top source/drain and second bottom source/drain;
   an upper channel pillar on the second bottom source/drain;
   a second top source/drain on the upper channel pillar, wherein the second top source/drain has the second conductivity type different from the first conductivity type;
   a lower gate structure dielectric layer on the lower channel pillar; and
   a first middle spacer between the conductive strap and the lower gate structure dielectric layer.

19. The vertically stacked set of the n-type VT FET and the p-type VT FET of claim 18, further comprising an upper gate structure dielectric layer on the upper channel pillar.

20. The vertically stacked set of the n-type VT FET and the p-type VT FET of claim 19, further comprising a lower gate electrode on the lower gate structure dielectric layer, an upper gate electrode on the upper gate structure dielectric layer, and a common electrical contact in electrical contact with the lower gate electrode and the upper gate electrode.

* * * * *